(12) United States Patent
Chen et al.

(10) Patent No.: US 8,353,325 B2
(45) Date of Patent: Jan. 15, 2013

(54) RETRACTABLE SHIELDING APPARATUS

(75) Inventors: Wen-Sheng Chen, Shenzhen (CN);
Zhi-Ming Zhao, Shenzhen (CN);
Zhen-Hua Xu, Shenzhen (CN);
Hai-Yuan Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 130 days.

(21) Appl. No.: 12/953,762

(22) Filed: Nov. 24, 2010

(65) Prior Publication Data

US 2012/0073766 A1    Mar. 29, 2012

(30) Foreign Application Priority Data

Sep. 28, 2010    (CN) .......................... 2010 1 0294838

(51) Int. Cl.
*E06B 3/48* (2006.01)
(52) U.S. Cl. ................................. 160/84.03; 160/84.06
(58) Field of Classification Search ............... 160/84.03, 160/84.06; 277/345; 312/1; 384/15
See application file for complete search history.

(56) References Cited

U.S. PATENT DOCUMENTS

| | | | | |
|---|---|---|---|---|
| 3,148,003 A * | 9/1964 | Deflandre | ........................ | 384/15 |
| 3,498,687 A * | 3/1970 | Diccianni | ........................ | 312/1 |
| 3,788,377 A * | 1/1974 | Knowles | .................... | 160/84.04 |
| 4,557,309 A * | 12/1985 | Judkins | ........................ | 160/84.06 |
| 4,673,018 A * | 6/1987 | Judkins | ........................ | 160/84.06 |
| 4,687,038 A * | 8/1987 | Clemente | .................... | 160/84.06 |
| 4,733,711 A * | 3/1988 | Schon | ........................ | 160/84.03 |
| 4,813,468 A * | 3/1989 | Fraser | ........................ | 160/84.03 |
| 4,825,929 A * | 5/1989 | Haines | ........................ | 160/84.06 |
| 4,986,508 A * | 1/1991 | Osawa et al. | .................. | 248/300 |
| 5,205,624 A * | 4/1993 | Martell et al. | .................... | 312/1 |
| 5,791,390 A * | 8/1998 | Watanabe | .................. | 160/84.03 |
| 5,860,711 A * | 1/1999 | Kronberg et al. | .................. | 312/1 |
| 6,296,413 B1 * | 10/2001 | McCann et al. | ................. | 403/51 |
| 6,516,856 B2 * | 2/2003 | Lai | ................ | 160/89 |
| 7,028,737 B2 * | 4/2006 | Hsu | ........................ | 160/84.03 |

* cited by examiner

*Primary Examiner* — David Purol
(74) *Attorney, Agent, or Firm* — Altis Law Group, Inc.

(57) ABSTRACT

A retractable shielding apparatus includes an adjusting base, a fixing base, two retractable shields, a shuttle, and a cable. The two retractable shields are assembled to two ends of the shuttle respectively with one corresponding end thereof. The adjusting base and the fixing base are respectively fixed to the opposite other end of the corresponding two retractable shields. The cable adjustably connects the adjusting base, the two retractable shields, the shuttle and the fixing base together. The shuttle is slidably located between the adjusting base and the fixing base and is configured to slide along the path formed by the cable, such that the two retractable shields can be extended or retracted together with the shuttle.

18 Claims, 4 Drawing Sheets

RETRACTABLE SHIELDING APPARATUS

BACKGROUND

1. Technical Field

The present disclosure relates to shielding apparatuses, and particularly, to a retractable shielding apparatus.

2. Description of Related Art

Shielding apparatuses are widely used in many fields to protect equipment from outside contaminant entry. However, the commonly used shielding apparatus cannot be adjusted and/or retracted.

Therefore, there is room for improvement in the art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the retractable shielding apparatus. Moreover, in the drawings like reference numerals designate corresponding parts throughout the several views. Wherever possible, the same reference numerals are used throughout the drawings to refer to the same or like elements of an embodiment.

DETAILED DESCRIPTION

Figure 1:
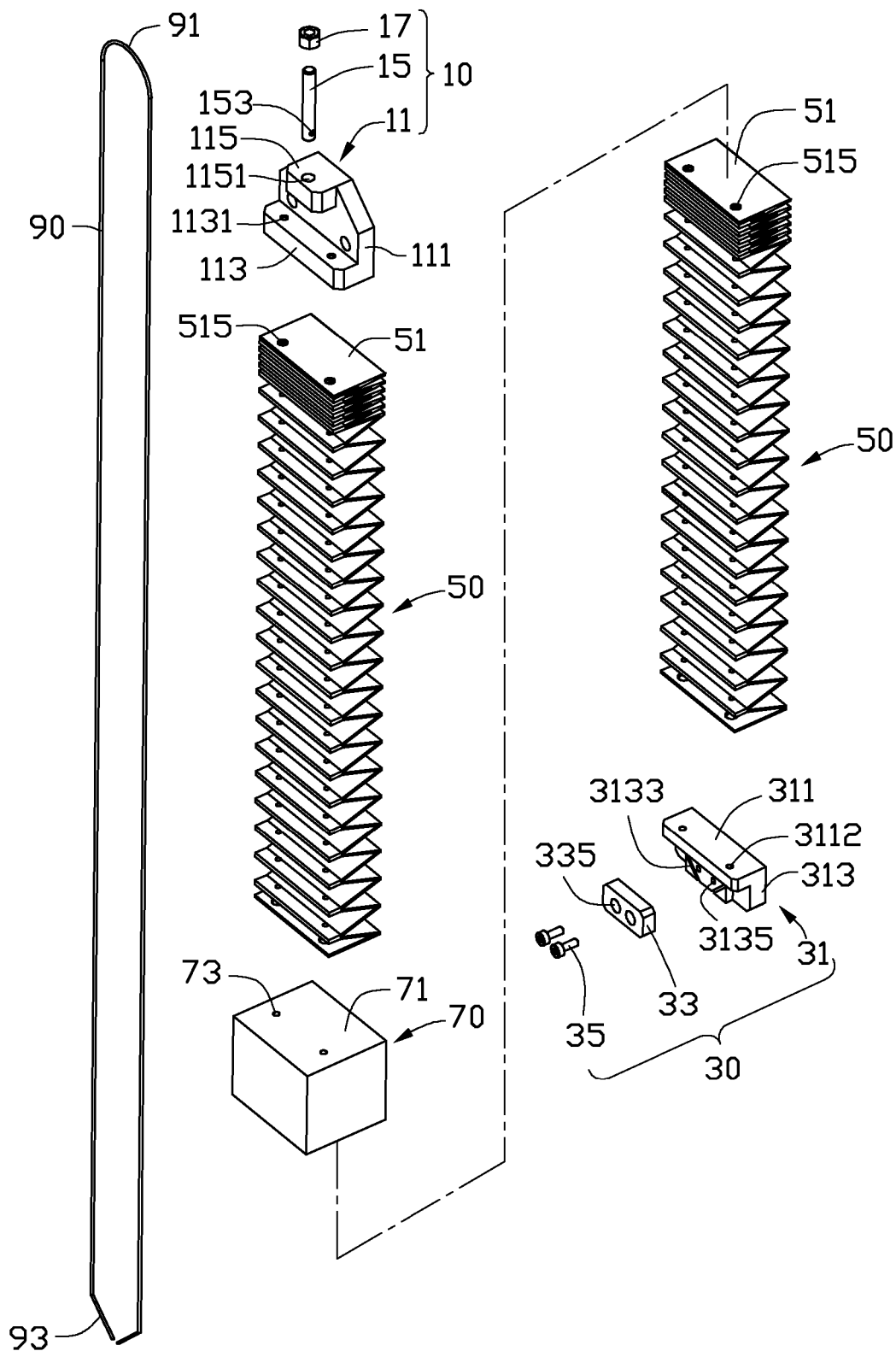
FIG. 1 is an exploded isometric view of an embodiment of a retractable shielding apparatus.
Figure 2:
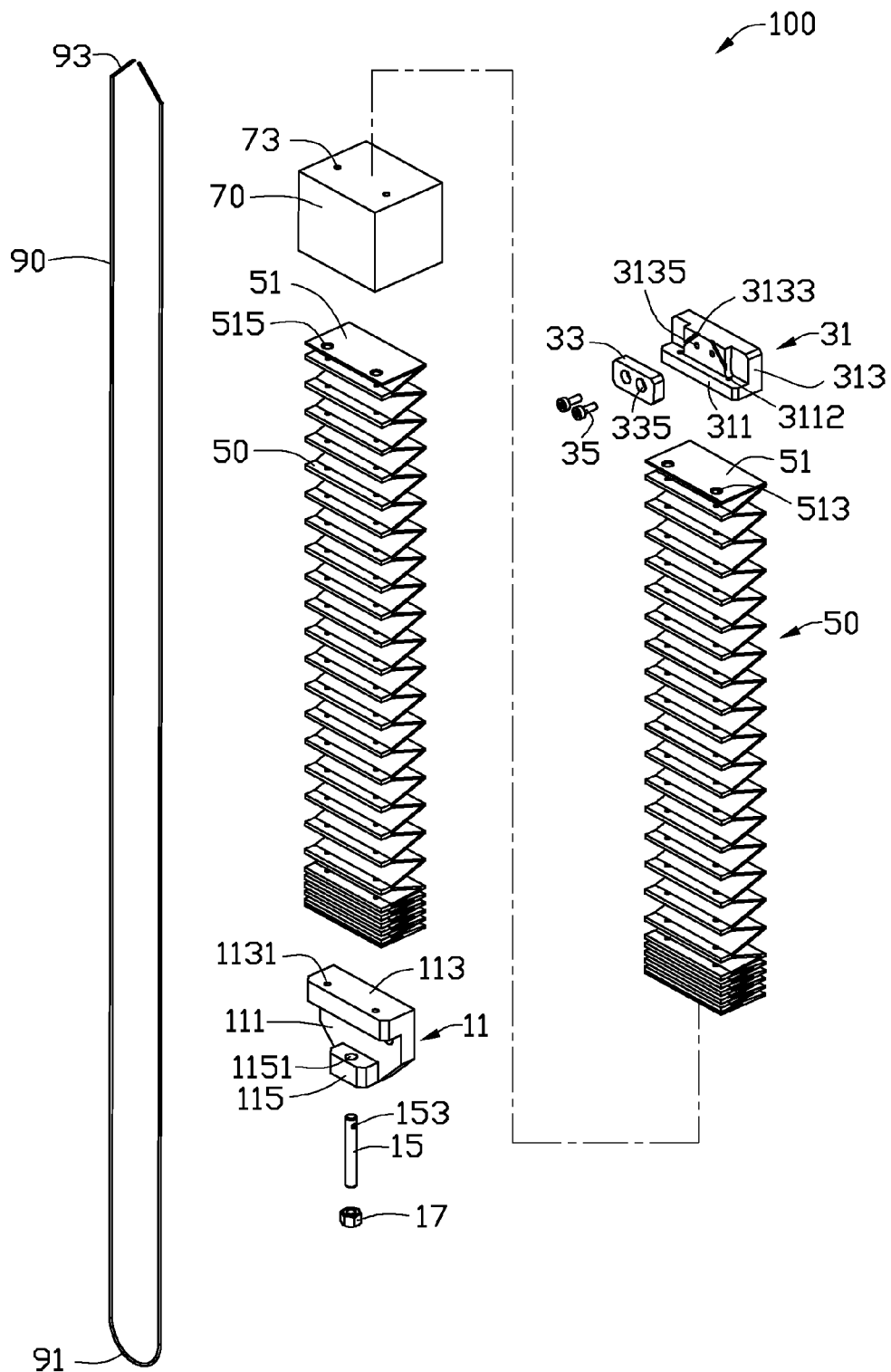
FIG. 2 is similar to FIG. 1, but viewed from another aspect.
Figure 3:
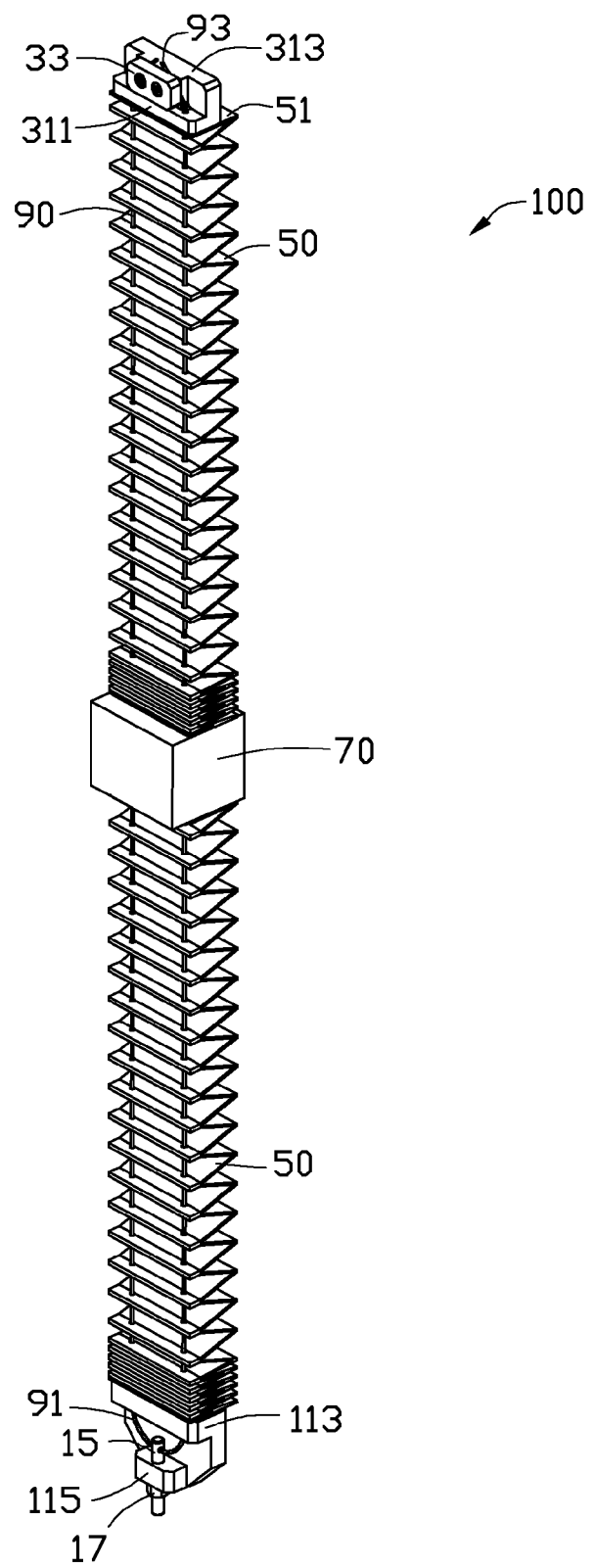
FIG. 3 is an assembled isometric view of the retractable shielding apparatus.
Figure 4:
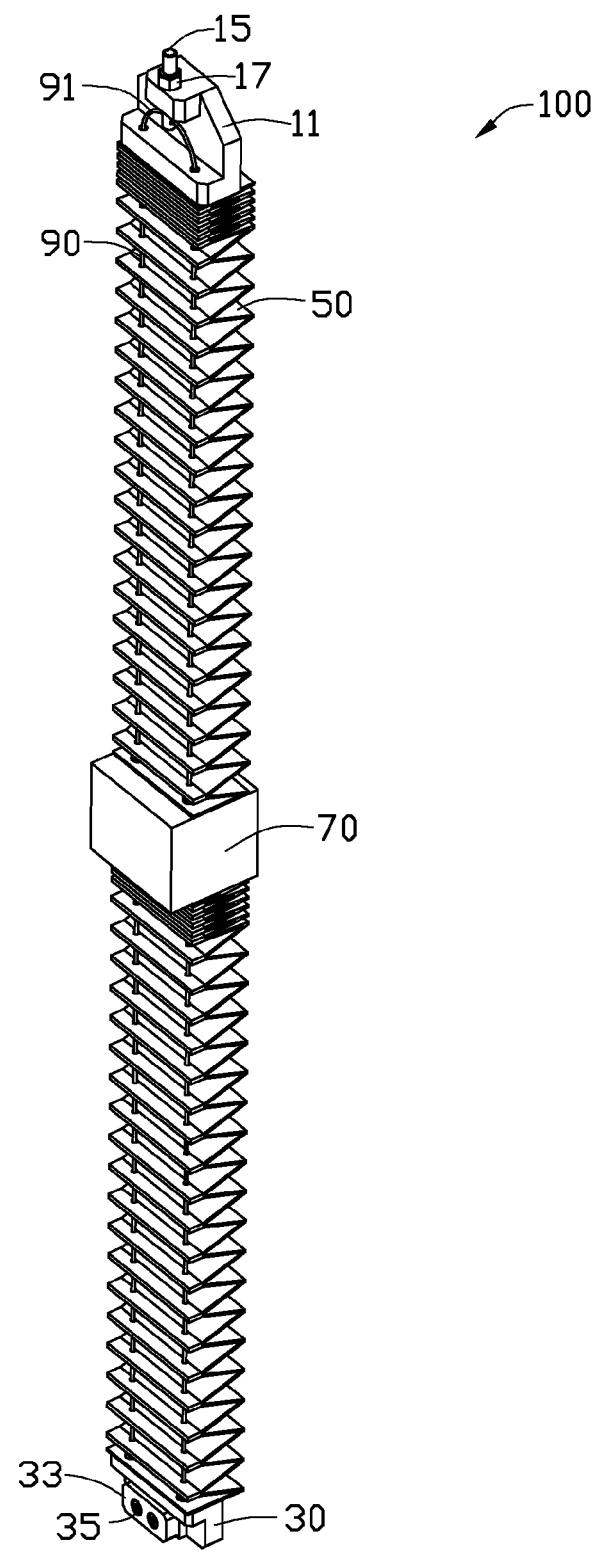
FIG. 4 is similar to FIG. 3, but viewed from another aspect.

Referring to FIGS. 1 through 4, an embodiment of a retractable shielding apparatus 100 is shown. The retractable shielding apparatus 100 includes an adjusting base 10, a fixing base 30, two retractable shields 50, a shuttle 70, and a cable 90. The two retractable shields 50 are secured to two ends of the shuttle 70 respectively with one corresponding end thereof, such that the shuttle 70 is sandwiched between the two retractable shields 50. The adjusting base 10 and the fixing base 30 are respectively fixed to the opposite other end of the corresponding two retractable shields 50. The cable 90 adjustably connects the adjusting base 10, the two retractable shields 50, the shuttle 70 and the fixing base 30 together. The shuttle 70 is slidably located between the adjusting base 10 and the fixing base 30 together with the two retractable shields 50, along a path formed by the cable 90. Meanwhile, the two retractable shields 50 are extended or retracted together with the shuttle 70.

The adjusting base 10 includes a base body 11, a threaded post 15, and a threaded retainer 17. The base body 11 is substantially U-shaped, and includes a base portion 111, a fixing portion 113, and an adjusting portion 115. The fixing portion 113 extends from one end of the base portion 111 and defines two assembly holes 1131 therethrough. The adjusting portion 115 extends from the opposite other end of the base portion 111. An adjustment hole 1151 is defined through the substantial center of the adjusting portion 115 toward the fixing portion. In this illustrated embodiment, the threaded post 15 is adjustably received in the adjusting portion 115 by passing through the adjustment hole 1151 thereof. A hanging hole 153 is defined through one end of the threaded post 15. The threaded retainer 17 is adjustably fastened on the opposite other end of the threaded post 15.

The fixing base 30 includes a bottom board 31, a contact board 33, and two fixing studs 35. The bottom board 31 is substantially L-shaped and has a fixing wall 311 and a sidewall 313 substantially perpendicular to the fixing wall 311. Two mounting holes 3112 are defined through the fixing wall 311, spaced from each other, and correspond to the two assembly holes 1131 of the base portion 111. Two channels 3133 are defined in one surface of the sidewall 313 toward the fixing wall 311. One end of the two channels 3133 is located adjacent to the two mounting holes 3112 of the fixing wall 311, and the opposite other end of the two channels 3133 is spaced and located at the substantial center of the edge of the sidewall 313. Two fixing holes 3135 are defined through the sidewall 313 and located between the two channels 3133. The contact board 33 is detachably fixed to the sidewall 313 of the bottom board 31 via the two fixing studs 35. Two securing holes 335 are defined through the contact board 33 corresponding to the two fixing holes 3135.

In the illustrated embodiment, the retractable shield 50 is made of elastic material and configured as a plurality of substantially rectangular elastic sheets 51 alternatingly hinged on one another like an accordion. When the retractable shield 50 is fully compressed, it forms a substantially rectangular block. During extension, it presents as longitudinal and is substantially accordioned. When fully extended, it forms a rectangle. Each elastic sheet 51 defines two connecting holes 515 spaced from each other corresponding to the two assembly holes 1131 of the base body 11.

The shuttle 70 is a substantially rectangular block or rectangular shield having two opposite substantially parallel assembly side surfaces 71. Each assembly side surface 71 defines two connecting holes 73 corresponding to the two connecting holes 515 of the corresponding retractable shield 50.

The cable 90 is flexible steel in the illustrated embodiment, and includes a curved hanging portion 91 formed at the substantial center thereof. The two ends of the cable 90 are bent to form two resisting ends 93 corresponding to the two channels 3133 of the bottom board 31.

During assembly of the retractable shielding apparatus 100, one end of the two retractable shields 50 is respectively secured to the two assembly side surfaces 71 of the shuttle 70, such that the shuttle 70 is sandwiched between the two retractable shields 50. The two connecting holes 515 of the retractable shield 50 align with the corresponding two connecting holes 73 of the shuttle 70. The hanging hole 153 end of the threaded post 15 passes through the adjustment hole 1151 of the adjusting portion 115 and is located between the adjusting portion 115 and the fixing portion 113. The threaded retainer 17 is screwed onto the opposite other end of the threaded post 15. One end of the cable 90 passes through the hanging hole 153 of the threaded post 15, and then, the two ends of the cable 90 respectively pass through the two assembly holes 1131 of the base body 11, pass through the connecting holes 515 of one retractable shield 50, the connecting holes 73 of the shuttle 70, and the connecting holes 515 of the other retractable shield 50 in turn. Finally, the two resisting ends 93 of the cable 90 pass through the two mounting holes 3112 of the bottom board 31 and are respectively latched into the two channels 3133 of the sidewall 313. The contact board 33 is fixed to the sidewall 313 via the two fixing studs 35, such that the two resisting ends 93 of the cable 90 are tightly sandwiched between the contact board 33 and the sidewall 313 of the bottom board 31. The adjusting portion 115 and the bottom board 31 are respectively assembled to the opposite other end of the two retractable shields 50 to finish the assembly of the retractable shielding apparatus 100.

In use, the retractable shielding apparatus 100 can be assembled upon a worktable, with the adjusting base 10 and the fixing base 30 respectively assembled to the two ends of the worktable. The shuttle 70 is accordingly fixed to a moving element (not shown) of the worktable so as to move together with the moving element, compressing or extending the corresponding retractable shield 50 to provide protection as needed.

It is to be understood, however, that even through numerous characteristics and advantages of the disclosure have been set forth in the foregoing description, together with details of the structure and function of the present disclosure, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A retractable shielding apparatus, comprising:
   a shuttle;
   two retractable shields secured to two ends of the shuttle respectively;
   an adjusting base fixed to a distal end of one retractable shield, the adjusting base comprising a base body, a threaded retainer, and a threaded post adjustably assembled to the base body via the threaded retainer, the threaded post having a first end and defining a hanging hole therethrough;
   a fixing base fixed to a distal end of the other retractable shield, the two retractable shields together with the shuttle being sandwiched between the adjusting base and the fixing base; and
   a cable having two ends and passing through the hanging hole of the threaded post and adjustably connecting the adjusting base, the two retractable shields, the shuttle and the fixing base together, such that the cable connects the two retractable shields and the shuttle together and the shuttle is slidably located between the adjusting base and the fixing base together with the two retractable shields, along a path formed by the cable.

2. The retractable shielding apparatus of claim 1, wherein the base body comprises a base portion and an adjusting portion extending from one end of the base portion; the adjusting portion defines an adjustment hole; the first end of the threaded post passes through the adjustment hole of the adjusting portion; and a second end of the threaded post opposite to the first end is screwed into the threaded retainer.

3. The retractable shielding apparatus of claim 2, wherein the base body further comprises a fixing portion; the fixing portion and the adjusting portion are located at two ends of the base portion and are substantially parallel to each other; the fixing portion defines two assembly holes; and the two ends of the cable respectively pass through the two assembly holes of the base body to connect the two retractable shields and the shuttle together.

4. The retractable shielding apparatus of claim 3, wherein each retractable shield is a substantially wave shaped strap and consists of a plurality of elastic sheets connected to each other; and each elastic sheet defines two connecting holes spaced from each other corresponding to the two assembly holes of the base body thereby enabling the two ends of the cable to pass therethrough.

5. The retractable shielding apparatus of claim 4, wherein each retractable shield is a folding dust shield made of elastic material.

6. The retractable shielding apparatus of claim 4, wherein the shuttle defines two connecting holes therethrough aligning with two corresponding connecting holes of the retractable shield, such that the two ends of the cable can pass through the two connecting holes and connect the two retractable shields together.

7. The retractable shielding apparatus of claim 6, wherein the shuttle is a substantially rectangular block or rectangular shield having two opposite substantially parallel assembly side surfaces, and the two connecting holes extend through the assembly side surfaces.

8. The retractable shielding apparatus of claim 3, wherein the fixing base comprises a bottom board and a contact board detachably fixed to the bottom board latching the two ends of the cable therebetween.

9. The retractable shielding apparatus of claim 8, wherein the bottom board comprises a fixing wall and a sidewall extending from the fixing wall, and the fixing wall defines two mounting holes corresponding to the two assembly holes of the base portion enabling the two ends of the cable to pass therethrough.

10. The retractable shielding apparatus of claim 9, wherein the cable comprises a curved hanging portion formed at the substantial center thereof and a bent resisting end formed at each end of the cable, the sidewall defines two channels corresponding to the two resisting ends of the cable, and the two resisting ends of the cable are latched into the two channels and tightly sandwiched between the contact board and the sidewall.

11. The retractable shielding apparatus of claim 10, wherein the cable is a bendable steel rope.

12. A retractable shielding apparatus, comprising:
   two retractable shields;
   a shuttle sandwiched between the two retractable shields;
   an adjusting base fixed to a distal end of one retractable shield, the adjusting base comprising a base body and a threaded post adjustably assembled to the base body, the threaded post defining a hanging hole;
   a fixing base fixed to a distal end of the other retractable shield; and
   a cable passing through the hanging hole of the threaded post and adjustably connecting the adjusting base, the two retractable shields, the shuttle and the fixing base together, with the cable connecting the two retractable shields and the shuttle together, thereby enabling the shuttle to be slidably located between the adjusting base and the fixing base to compress and extend the two retractable shields along a path formed by the cable.

13. The retractable shielding apparatus of claim 12, wherein the base body includes a base portion and an adjusting portion extending from the base portion; the adjusting portion defines an adjustment hole; and the first end of the threaded post passes through the adjustment hole of the adjusting portion.

14. The retractable shielding apparatus of claim 13, wherein the base body further comprises a fixing portion; the fixing portion and adjusting portion are located at two ends of the base portion substantially parallel to each other; the fixing portion defines two assembly holes; and the two ends of the cable respectively pass through the two assembly holes of the base body to connect the two retractable shields and the shuttle together.

15. The retractable shielding apparatus of claim 14, wherein each retractable shield is a substantially wave shaped strap and consists of a plurality of elastic sheets connected to each other; and each elastic sheet defines two connecting holes spaced from each other corresponding to the two assembly holes of the base body thereby enabling the two ends of the cable to pass therethrough.

16. The retractable shielding apparatus of claim 15, wherein the fixing base comprises a bottom board and a contact board detachably fixed to the bottom board latching the two ends of the cable therebetween.

17. The retractable shielding apparatus of claim 16, wherein the bottom board comprises a fixing wall and a sidewall extending from the fixing wall, and the fixing wall defines two mounting holes corresponding to the two assembly holes of the base portion enabling the two ends of the cable to pass therethrough.

18. The retractable shielding apparatus of claim 17, wherein the cable comprises a curved hanging portion formed at the substantial center thereof and a bent resisting end formed at each end of the cable, the sidewall defines two channels corresponding to the two resisting ends of the cable, and the two resisting ends of the cable are latched into the two channels and tightly sandwiched between the contact board and the sidewall.

* * * * *